(12) United States Patent
Huang

(10) Patent No.: US 7,178,583 B2
(45) Date of Patent: Feb. 20, 2007

(54) FAN MODULE FOR A HEAT DISSIPATING DEVICE

(75) Inventor: Yu-Long Huang, Hsin-Chuang (TW)

(73) Assignee: Asia Vital Components Co., Ltd., Kaohsiung (TW)

(*) Notice: Subject to any disclaimer, the term of this patent is extended or adjusted under 35 U.S.C. 154(b) by 0 days.

(21) Appl. No.: 10/984,763

(22) Filed: Nov. 10, 2004

(65) Prior Publication Data
US 2006/0021733 A1  Feb. 2, 2006

(30) Foreign Application Priority Data
Jul. 30, 2004  (CN)  ........................ 2004 1 0070260

(51) Int. Cl.
*H05K 7/20*  (2006.01)
(52) U.S. Cl. ...................... 165/121; 361/697; 165/80.3
(58) Field of Classification Search ............... 165/80.3, 165/119, 121, 185
See application file for complete search history.

(56) References Cited

U.S. PATENT DOCUMENTS

| | | | |
|---|---|---|---|
| 5,000,079 A * | 3/1991 | Mardis | 454/184 |
| 5,551,841 A * | 9/1996 | Kamada | 417/89 |
| 6,145,586 A * | 11/2000 | Lo | 165/80.3 |
| 6,199,624 B1* | 3/2001 | Wotring | 165/80.3 |
| 6,404,630 B1* | 6/2002 | Lai | 361/697 |
| 6,449,152 B1* | 9/2002 | Lin | 361/697 |
| 6,450,248 B1* | 9/2002 | Chang | 165/80.3 |
| 6,791,837 B2* | 9/2004 | Chen et al. | 361/695 |
| 6,822,870 B2* | 11/2004 | Hong et al. | 361/704 |
| 6,940,716 B1* | 9/2005 | Korinsky et al. | 361/695 |
| 6,978,827 B2* | 12/2005 | Armstrong | 165/80.3 |
| 2005/0270740 A1* | 12/2005 | Tai et al. | 361/690 |

* cited by examiner

*Primary Examiner*—Allen J. Flanigan
(74) *Attorney, Agent, or Firm*—Pillsbury Winthrop Shaw Pittman, LLP

(57) ABSTRACT

A heat dissipating device includes a fin unit disposed on a supporting seat, and an anchoring frame disposed on the fin unit and engaging detachably the supporting seat for anchoring the fin unit between the supporting seat and the anchoring frame. A fan module includes a fan unit having a fan blade disposed in a fan housing that is mounted on the fin unit, a connecting seat mounted on the fan housing and formed with a through hole that is in fluid communication with an inlet hole in the fan housing, and an air guiding member mounted on the connecting seat and confining an air passage that is in fluid communication with the through hole in the connecting seat. The fan unit is operable so as to draw external air toward the fin unit via the air passage.

5 Claims, 5 Drawing Sheets

FAN MODULE FOR A HEAT DISSIPATING DEVICE

CROSS-REFERENCE TO RELATED APPLICATION

This application claims priority of Chinese Application No. 2004100702602, filed on Jul. 30, 2004.

BACKGROUND OF THE INVENTION

1. Field of the Invention

The invention relates to a heat dissipating device, more particularly to a heat dissipating device with a fan module.

2. Description of the Related Art

FIGS. 1 and 2 illustrate a conventional heat dissipating device 100 disclosed in U.S. Pat. No. 6,450,248. The conventional heat dissipating device 100 includes a supporting seat 121, a fin unit 11, an anchoring frame 122, and a fan unit 13. The supporting seat 121 is disposed to surround a CPU 2. The fin unit 11 is disposed on the supporting seat 121 such that the fin unit 11 contacts the CPU 2. The anchoring frame 122 is disposed on the fin unit 11, and engages detachably the supporting seat 121 by virtue of engagement between engaging holes 1211 formed in the supporting seat 121 and engaging lugs 1224 formed on the anchoring frame 122 for anchoring the fin unit 11 between the supporting seat 121 and the anchoring frame 122. The fan unit 13 is mounted on the fin unit 11. The fan unit 13 includes a fan housing formed with an air inlet 130. It is noted that air flows into the air inlet 130 from all directions such that airflow into the air inlet 130 is turbulent and disorderly, thereby resulting in a relatively poor heat-dissipating efficiency.

SUMMARY OF THE INVENTION

Therefore, the object of the present invention is to provide a heat dissipating device with a fan module that can result in a relatively good heat-dissipating efficiency.

According to one aspect of the present invention, a fan module comprises:

a fan unit including a fan housing, and a fan blade disposed in the fan housing, the fan housing being formed with inlet and outlet holes;

a connecting seat mounted on the fan housing and formed with a through hole that is in fluid communication with the inlet hole in the fan housing; and an air guiding member mounted on the connecting seat and confining an air passage that is in fluid communication with the through hole in the connecting seat.

According to another aspect of the present invention, a heat dissipating device comprises:

a supporting seat;

a fin unit disposed on the supporting seat;

an anchoring frame disposed on the fin unit and engaging detachably the supporting seat for anchoring the fin unit between the supporting seat and the anchoring frame; and a fan module including a fan unit including a fan housing mounted on the fin unit, and a fan blade disposed in the fan housing, the fan housing being formed with inlet and outlet holes, a connecting seat mounted on the fan housing and formed with a through hole that is in fluid communication with the inlet hole in the fan housing, and an air guiding member mounted on the connecting seat and confining an air passage that is in fluid communication with the through hole in the connecting seat, the fan unit being operable so as to draw external air toward the fin unit via the air passage.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
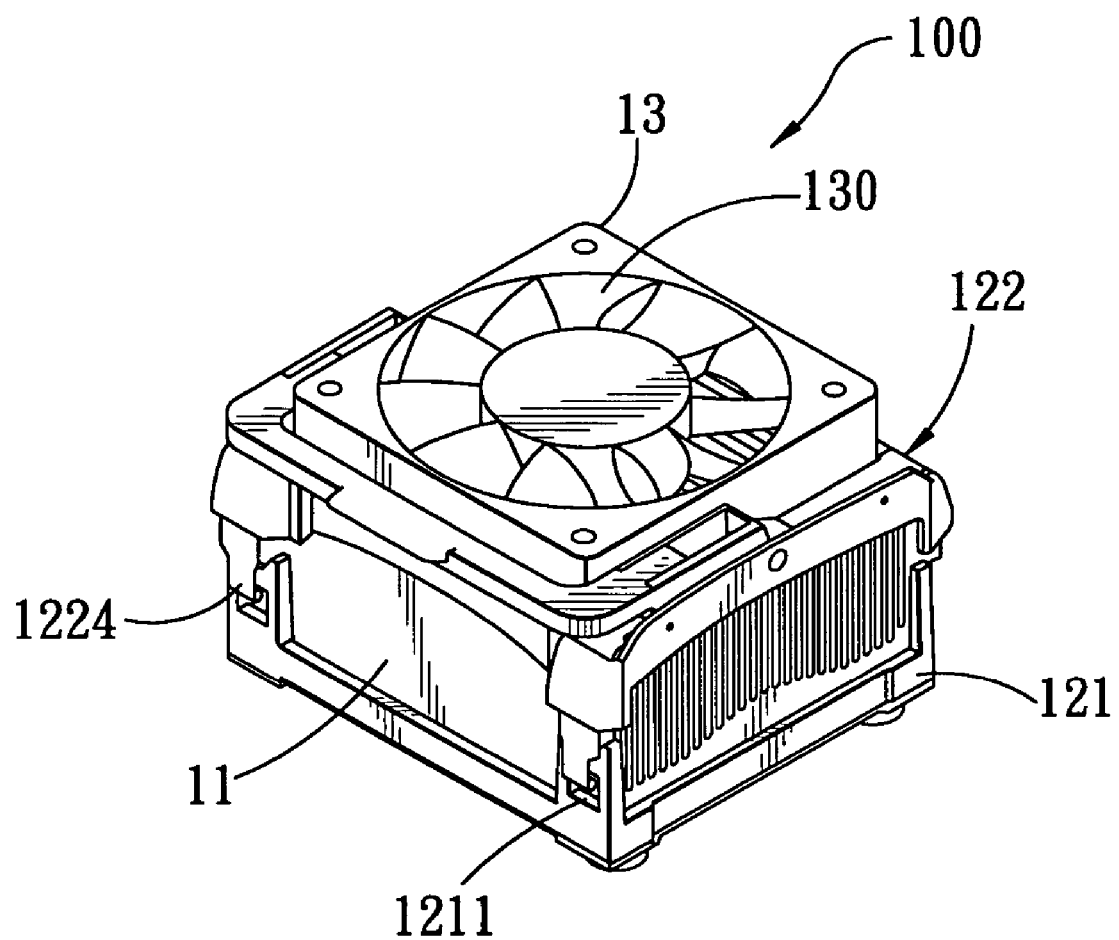
FIG. 1 is a perspective view of a conventional heat dissipating device.
Figure 2:
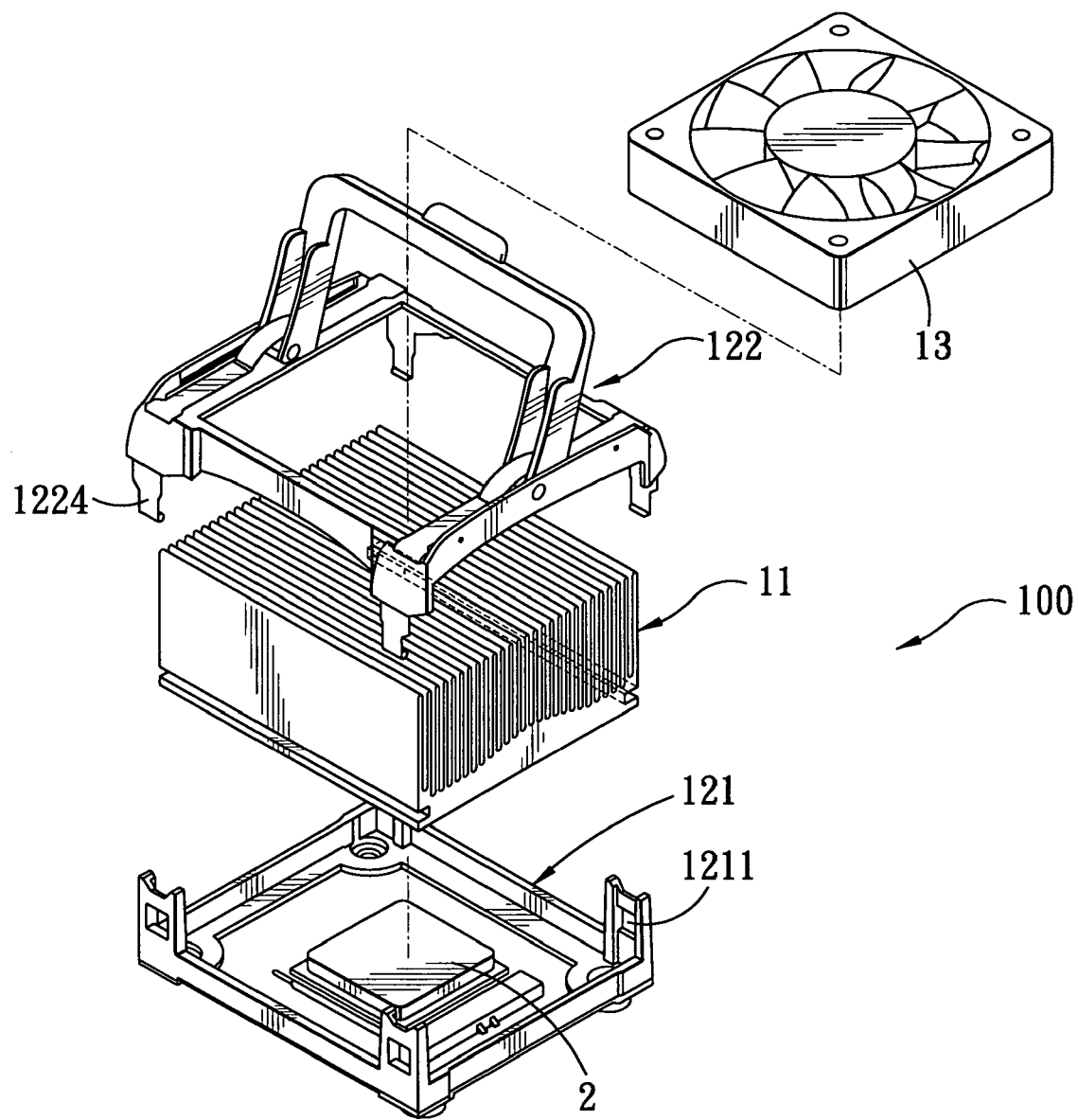
FIG. 2 is an exploded perspective view of the conventional heat dissipating device.
Figure 3:
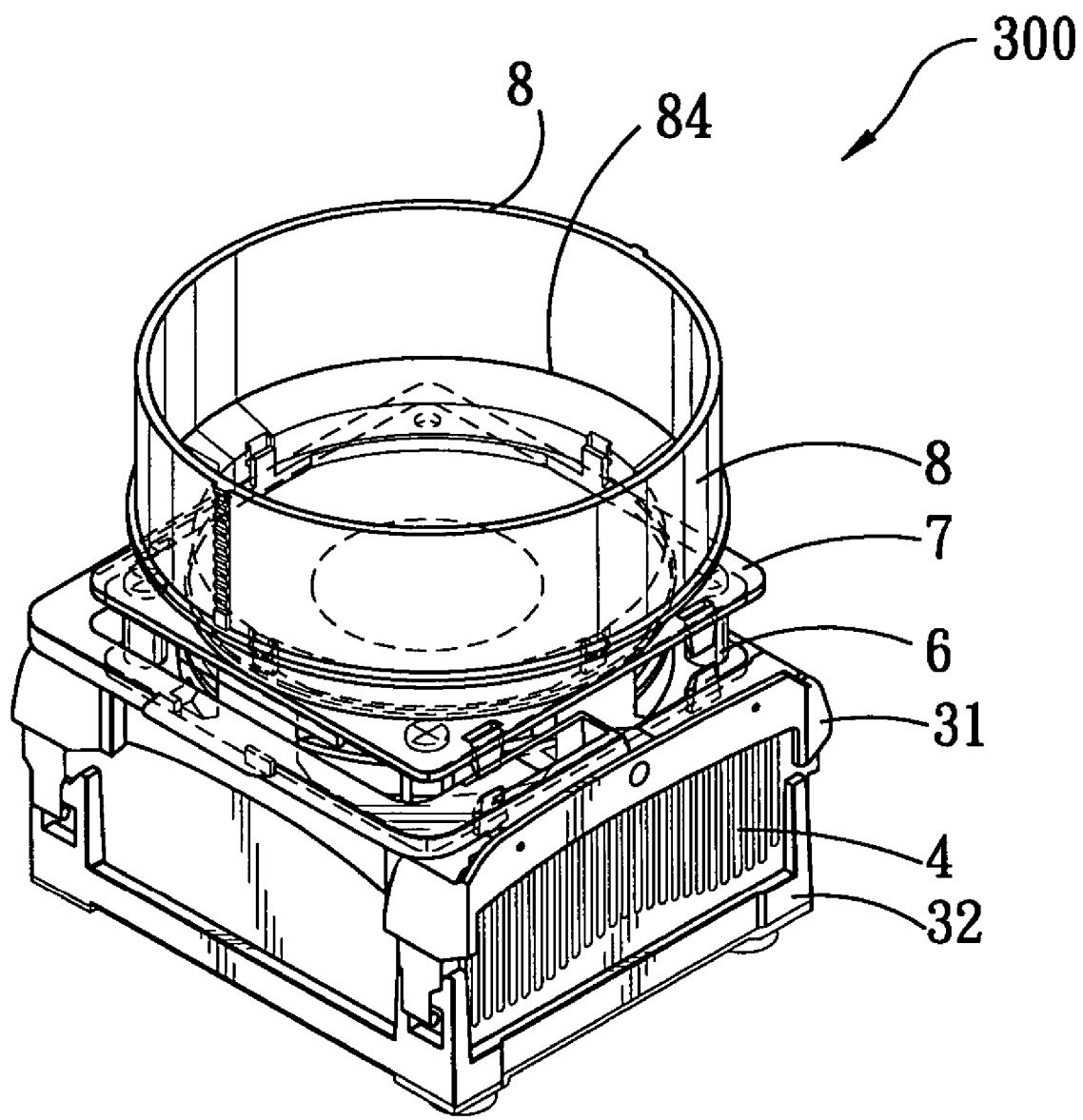
FIG. 3 is a perspective view showing the preferred embodiment of a heat dissipating device according to the present invention.
Figure 4:
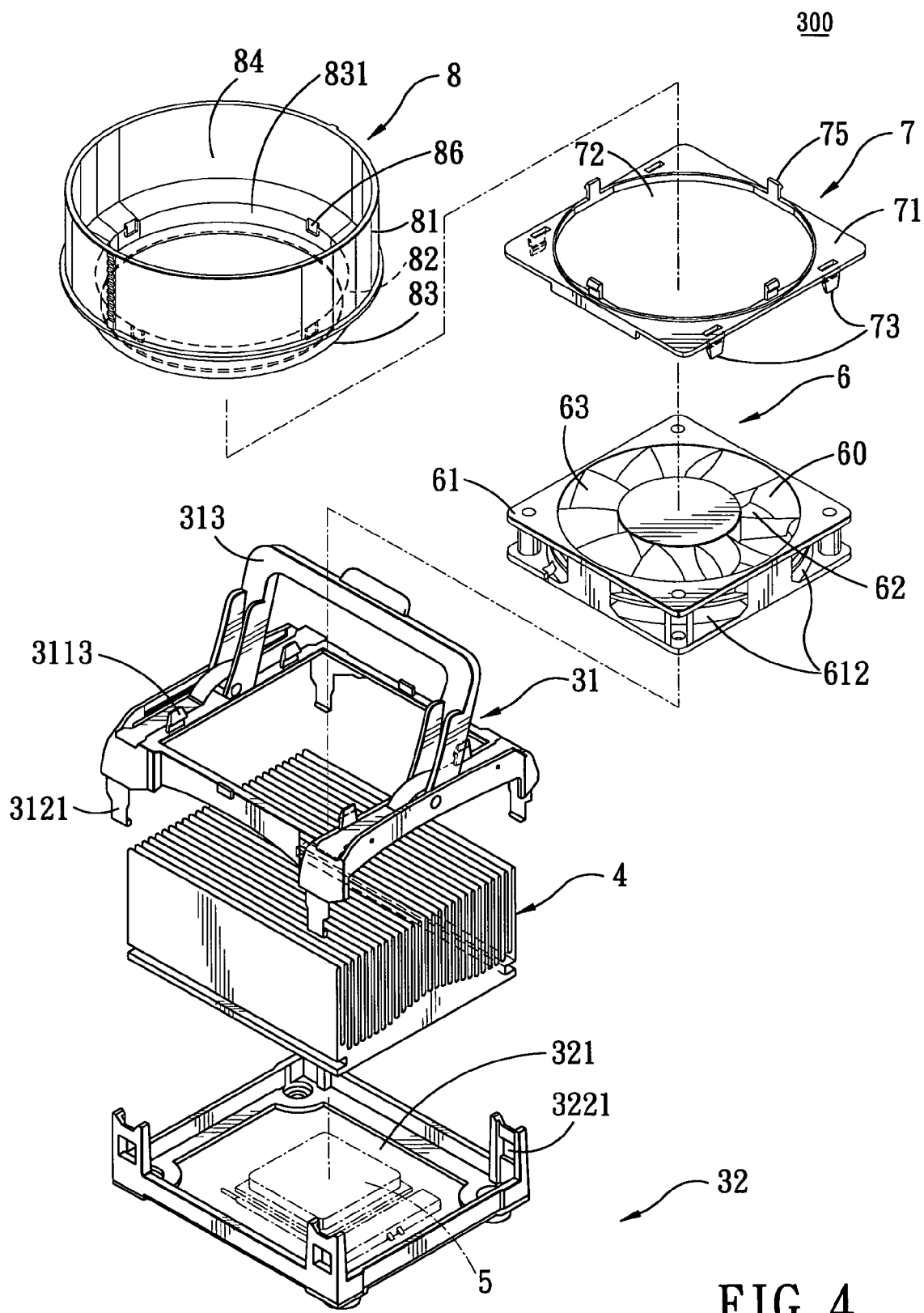
FIG. 4 is an exploded perspective view showing the preferred embodiment.

Referring to FIGS. 3 and 4, the preferred embodiment of a heat dissipating device 300 according to the present invention is shown to include a supporting seat 32, s fin unit 4, an anchoring frame 31, and a fan module.

The supporting seat 32 is disposed to surround a CPU 5, and is formed with a central opening 321 that is adapted to permit extension of the CPU 5 therethrough, and four engaging holes 3221.

The fin unit 4 is disposed on the supporting seat 32 such that the fin unit 4 is adapted to contact the CPU 5.

The anchoring frame 31 is disposed on the fin unit 4, and is formed with four engaging lugs 3121 that engage respectively and detachably the engaging holes 3221 in the supporting seat 32 for anchoring the fin unit 4 between the supporting seat 32 and the anchoring frame 31.

Figure 5:
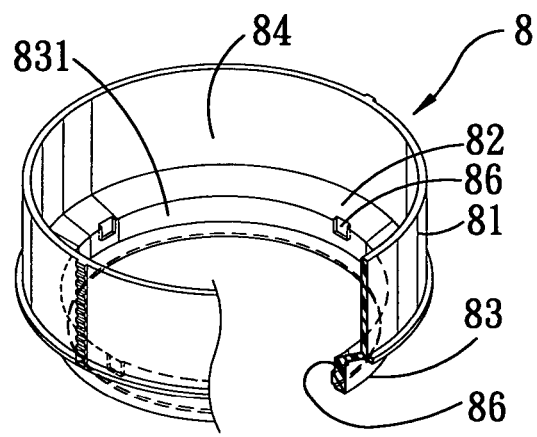
FIG. 5 is a fragmentary perspective view showing an air guiding member of the preferred embodiment.

The fan module includes a fan unit 6, a connecting seat 7, and a tubular air guiding member 8. The fan unit 6 includes a fan housing 61 mounted on the fin unit 4 in a known manner, and a fan blade 63 disposed in the fan housing 61. The fan housing 61 is formed with inlet and outlet holes 60, 62. The connecting seat 7 is mounted on the fan housing 61, and is formed with a through hole 72 that is in fluid communication with the inlet hole 60 in the fan housing 61. The air guiding member 8 is mounted on the connecting seat 7, and confines an air passage 84 that is in fluid communication with the through hole 72 in the connecting seat 7. In this embodiment, the air guiding member 8 has a large-diameter first tube portion 81, a small-diameter second tube portion 83, and an annular shoulder 82 between the first and second portions 81, 83, as shown in FIG. 5. As such, the fan unit 6 is operable so as to draw external air toward the fin unit 4 via the air passage 84, as shown in FIG. 3.

In this embodiment, the heat dissipating device 300 further includes a first interlocking unit for interlocking the fan housing 61 and the anchoring frame 31, a second interlocking unit for interconnecting the connecting seat 7 and the fan housing 61, and a third interlocking unit for interconnecting the air guiding member 8 and the connecting seat 7. The first interlocking unit includes a plurality of engaging recesses 612 that are formed in the fan housing 61, and a plurality of engaging pieces 3113 that are formed on the anchoring frame 31 to engage the engaging recesses 612, respectively. The second interlocking unit includes the engaging recesses 612 in the fan housing 61, and a plurality of engaging pieces 73 that are formed on the connecting seat 7 to engage the engaging recesses 612, respectively. The third interlocking unit includes a plurality of anchoring grooves 86 that are formed in an inner surface 831 of the second tube portion 83 of the air guiding member 8, and a plurality of anchoring pieces 75 that are formed on the connecting seat 7 to engage the anchoring grooves 86, respectively.

Figure 6:
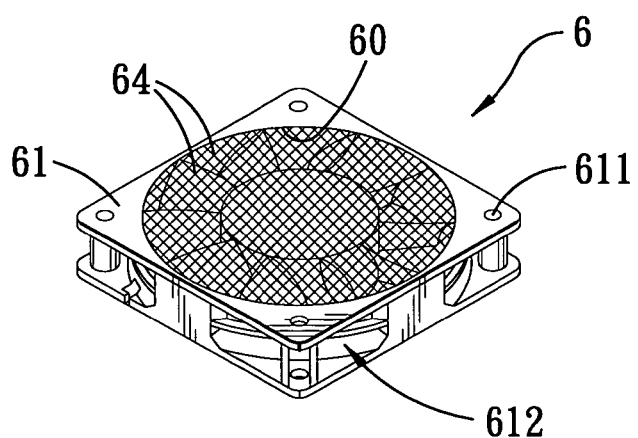
FIG. 6 is a perspective view showing a modified fan unit of the preferred embodiment.
Figure 7:
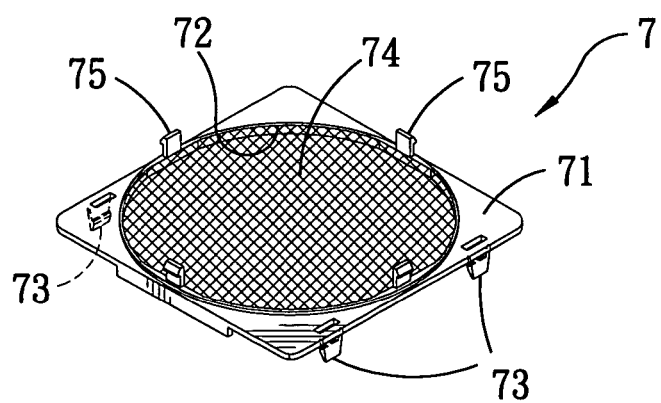
FIG. 7 is a perspective view showing a modified connecting seat of the preferred embodiment.

Furthermore, in order to prevent dust from entering into the fan housing 61, air filter layers 64, 74 may be mounted in the inlet hole 60 of the fan housing 61 and the through hole 72 of the connecting seat 7, respectively, as shown in FIGS. 6 and 7.

To sum up, due to the presence of the air guiding member 8, external air can be guided toward the fin unit 4 via the air passage 84 of the air guiding member 8, thereby resulting in a relatively good heat-dissipating efficiency.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A fan module comprising:
   a fan unit including a fan housing, and a fan blade disposed in said fan housing, said fan housing being formed with inlet and outlet holes;
   a connecting seat mounted on said fan housing and formed with a through hole that is in fluid communication with said inlet hole in said fan housing;
   an air guiding member mounted on said connecting seat and confining an air passage that is in fluid communication with said through hole in said connecting seat; and
   an interlocking unit including a plurality of engaging recesses formed in one of said fan housing and said connecting seat, and a plurality of engaging pieces provided on the other one of said fan housing and said connecting seat to engage said engaging recesses, respectively.

2. A fan module comprising:
   a fan unit including fan housing, and a fan blade disposed in said fan housing, said fan housing being formed with inlet and outlet holes;
   a connecting seat mounted on said fan housing and formed with a through hole that is in fluid communication with said inlet hole in said fan housing;
   an air guiding member mounted on said connecting seat and confining an air passage that is in fluid communication with said through hole in said connecting seat; and
   an interlocking unit including a plurality of anchoring grooves formed in one of said air guiding member and said connecting seat, and a plurality of anchoring pieces provided on the other one of said air guiding member and said connecting seat to engage said anchoring grooves, respectively.

3. A heat dissipating device comprising:
   a supporting seat;
   a fin unit disposed on said supporting seat;
   an anchoring frame disposed on said fin unit and engaging detachably said supporting seat for anchoring said fin unit between said supporting seat and said anchoring frame;
   a fan module including:
     a fan unit including a fan housing mounted on said fin unit, and a fan blade disposed in said fan housing, said fan housing being formed with inlet and outlet holes,
     a connecting seat mounted on said fan housing and formed with a through hole that is in fluid communication with said inlet hole in said fan housing, and
     an air guiding member mounted on said connecting seat and confining an air passage that is in fluid communication with said through hole in said connecting seat,
     said fan unit being operable so as to draw external air toward said fin unit via said air passage; and
   an interlocking unit including a plurality of engaging recesses formed in one of said fan housing and said connecting seat, and a plurality of engaging pieces provided on the other one of said fan housing and said connecting seat to engage said engaging recesses, respectively.

4. A heat dissipating device comprising:
   a supporting seat;
   a fin unit disposed on said supporting seat;
   an anchoring frame disposed on said fin unit and engaging detachably said supporting seat for anchoring said fin unit between said supporting seat and said anchoring frame;
   a fan module including:
     a fan unit including a fan housing mounted on said fin unit, and a fan blade disposed in said fan housing, said fan housing being formed with inlet and outlet holes,
     a connecting seat mounted on said fan housing and formed with a through hole that is in fluid communication with said inlet hole in said fan housing, and
     an air guiding member mounted on said connecting seat and confining an air passage that is in fluid communication with said through hole in said connecting seat,
     said fan unit being operable so as to draw external air toward said fin unit via said air passage; and
   an interlocking unit including a plurality of anchoring grooves formed in one of said air guiding member and said connecting seat, and a plurality of anchoring pieces provided on the other one of said air guiding member and said connecting seat to engage said anchoring grooves, respectively.

5. A heat dissipating device comprising:
   a supporting seat;
   a fin unit disposed on said supporting seat;
   an anchoring frame disposed on said fin unit and engaging detachably said supporting seat for anchoring said fin unit between said supporting seat and said anchoring frame;

a fan module including;
- a fan unit including a fan housing mounted on said fin unit, and a fan blade disposed in said fan housing, said fan housing being formed with inlet and outlet holes,
- a connecting seat mounted on said fan housing and formed with a through hole that is in fluid communication with said inlet hole in said fan housing, and
- an air guiding member mounted on said connecting seat and confining an air passage that is in fluid communication with said through hole in said connecting seat,
- said fan unit being operable so as to draw external air toward said fin unit via said air passage; and
- a plurality of engaging recesses formed in one of said fan housing and said anchoring frame, and a plurality of engaging pieces provided on the other one of said fan housing and said anchoring frame to engage said engaging recesses, respectively.

* * * * *

UNITED STATES PATENT AND TRADEMARK OFFICE
CERTIFICATE OF CORRECTION

PATENT NO. : 7,178,583 B2 Page 1 of 1
APPLICATION NO. : 10/984763
DATED : February 20, 2007
INVENTOR(S) : Huang It is certified that error appears in the above-identified patent and that said Letters Patent is hereby corrected as shown below:

On Title Page
item (30) Foreign Application Priority Data

July 30, 2004 (CN) ................ "2004 1 0070260" should read
      --2004100702602--

Signed and Sealed this

Eighth Day of May, 2007

JON W. DUDAS
*Director of the United States Patent and Trademark Office*